(12) United States Patent
Stauffer et al.

(10) Patent No.: US 10,404,058 B2
(45) Date of Patent: Sep. 3, 2019

(54) CIRCUIT FOR LOSS OF PHASE DETECTION

(71) Applicant: Regal Beloit America, Inc., Beloit, WI (US)

(72) Inventors: Zachary Joseph Stauffer, Fort Wayne, IN (US); Luis D. Morales, Fort Wayne, IN (US); Maung Saw Eddison, Fort Wayne, IN (US)

(73) Assignee: Regal Beloit America, Inc., Beloit, WI (US)

( * ) Notice: Subject to any disclaimer, the term of this patent is extended or adjusted under 35 U.S.C. 154(b) by 0 days.

(21) Appl. No.: 15/823,048

(22) Filed: Nov. 27, 2017

(65) Prior Publication Data
US 2019/0165566 A1 May 30, 2019

(51) Int. Cl.
| | |
|---|---|
| *H02P 6/06* | (2006.01) |
| *H02H 7/09* | (2006.01) |
| *H02H 3/08* | (2006.01) |
| *G01R 19/165* | (2006.01) |
| *H02H 3/253* | (2006.01) |
| *H02H 1/04* | (2006.01) |
| *H02M 5/14* | (2006.01) |

(52) U.S. Cl.
CPC ......... *H02H 7/09* (2013.01); *G01R 19/16504* (2013.01); *H02H 1/046* (2013.01); *H02H 3/083* (2013.01); *H02H 3/253* (2013.01); *H02M 5/14* (2013.01)

(58) Field of Classification Search
CPC ....................................................... H02H 7/09
USPC ..................................................... 318/400.22
See application file for complete search history.

(56) References Cited

U.S. PATENT DOCUMENTS

| | | |
|---|---|---|
| 4,751,653 A | 6/1988 | Junk et al. |
| 4,823,226 A | 4/1989 | Reed et al. |
| 5,751,132 A | 5/1998 | Horvath et al. |
| 7,990,092 B2 | 8/2011 | Woodward |
| 8,362,724 B2 | 1/2013 | Woodward |
| 8,362,737 B2 | 1/2013 | Woodward |
| 8,487,580 B2 | 7/2013 | Woodward |
| 2009/0167229 A1 | 7/2009 | Brunner et al. |
| 2009/0189555 A1* | 7/2009 | Chen ................... H02P 21/0089 318/400.07 |
| 2010/0060228 A1 | 3/2010 | Woodward |
| 2012/0001574 A1* | 1/2012 | Akaishi .................... H02P 21/06 318/400.04 |
| 2013/0106331 A1* | 5/2013 | Guzelgunler ........... H02P 29/02 318/400.21 |
| 2013/0155729 A1* | 6/2013 | Lee ......................... H02P 23/12 363/37 |
| 2015/0123580 A1* | 5/2015 | Omata ................... H02P 29/032 318/400.17 |
| 2016/0013740 A1 | 1/2016 | Skinner et al. |
| 2016/0013746 A1 | 1/2016 | Skinner et al. |
| 2016/0181960 A1* | 6/2016 | Hattori .................... H02P 21/00 318/400.02 |

(Continued)

*Primary Examiner* — Erick D Glass
(74) *Attorney, Agent, or Firm* — Armstrong Teasdale LLP

(57) ABSTRACT

A circuit for detecting loss of phase in three-phase power systems. The circuit includes a current sensor and a microprocessor. The current sensors are coupled to respective phases of a three-phase power source configured to supply power to a load. The microprocessor is coupled to the current sensors to process current measurements and detect loss of phase in the three-phase power source.

20 Claims, 4 Drawing Sheets

(56) References Cited

U.S. PATENT DOCUMENTS

2017/0272023 A1* 9/2017 Ahmed .................. H02P 27/08

* cited by examiner

US 10,404,058 B2

CIRCUIT FOR LOSS OF PHASE DETECTION

BACKGROUND

The field of the disclosure relates generally to detecting loss of phase, and more specifically, to circuits and methods for detecting loss of phase in three-phase power systems using current measurements of each independent phase.

Three-phase power sources are used in numerous varieties and applications worldwide. For example, at least some heating, ventilation, and air conditioning (HVAC) systems and three-phase motors are powered by three-phase power sources. Detecting loss of phase and power imbalance in three-phase power sources is vital in operating three-phase power systems to reduce wear and prevent equipment overheating and shut down.

Known three-phase power systems generally utilize voltage monitoring for loss of phase detection. Voltage monitoring typically focuses on the amplitude of the voltage provided by each phase. Phase imbalance and distortion generally cannot be detected, and power and efficiency generally cannot be calculated from amplitude measurements without frequency or period measurements. Further, a high voltage line of the three-phase power source is generally directly attached to a microprocessor that processes the voltage measurements. In such configurations, a surge in voltage in the system can overload and damage the microprocessor, rendering the microprocessor inoperable and unable to process the voltage measurements.

BRIEF DESCRIPTION

In one aspect, a circuit for detecting loss of phase in a three-phase power system using current measurements of each phase is provided. The circuit includes a current sensors and a microprocessor. The current sensors are coupled to respective phases of a three-phase power source configured to supply power to a load. The microprocessor is coupled to the current sensors to process current measurements and detect loss of phase in the three-phase power source.

In another aspect, a three-phase power system with loss of phase detection is provided. The system comprises a plurality of AC buses, an inverter, a three-phase motor, a plurality of current sensors, and a microprocessor. The plurality of AC buses are configured to be coupled to a three-phase power source. The three-phase motor is configured to be powered by a three-phase power source. The plurality of current sensors are coupled to the three-phase motor. The microprocessor is coupled to the plurality of current sensors and figured to receive current measurements from the plurality of current sensors and detect a loss of at least one respective phase based on the current measurements.

In yet another aspect, a method for detecting a loss of phase in three-phase equipment is provided. The method comprises measuring amplitudes and phases of a plurality of current sensors coupled to respective phases of the three-phase power source. The method also includes receiving, at a microprocessor, current measurements from the plurality of current sensors coupled to respective phases of the three-phase power source. Further, the method includes comparing the plurality of current measurements from the plurality of current sensors to one another and detecting a loss of phase of at least one of the respective phases based on the current measurements from the plurality of current sensors.

DETAILED DESCRIPTION

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

Three-phase power systems typically utilize voltage sensors to detect a loss of phase in three-phase power sources. Embodiments of the systems and methods described herein utilize current sensors to detect loss of phase in a three-phase power source to further enable measurement of the amplitude of the current provided by each phase, and to enable period and frequency to be calculated from the current amplitudes over time, and avoid loss of resolution of current measurements and amplitude-only measurements that voltage sensors provide. Amplitude and phase measurements may further be used in loss of phase detection, phase imbalance detection, distortion detection, and in current frequency, power, and load efficiency calculations.

Embodiments of the systems and methods described herein utilize current sensors to detect loss of phase in a three-phase power source and coupling the current sensors to a microprocessor to detect loss of phase fully and isolate the microprocessor from high voltage lines of the three-phase power source. Isolating the microprocessor from the high voltage line protects the microprocessor from voltage surges that may damage the microprocessor.

Figure 1:
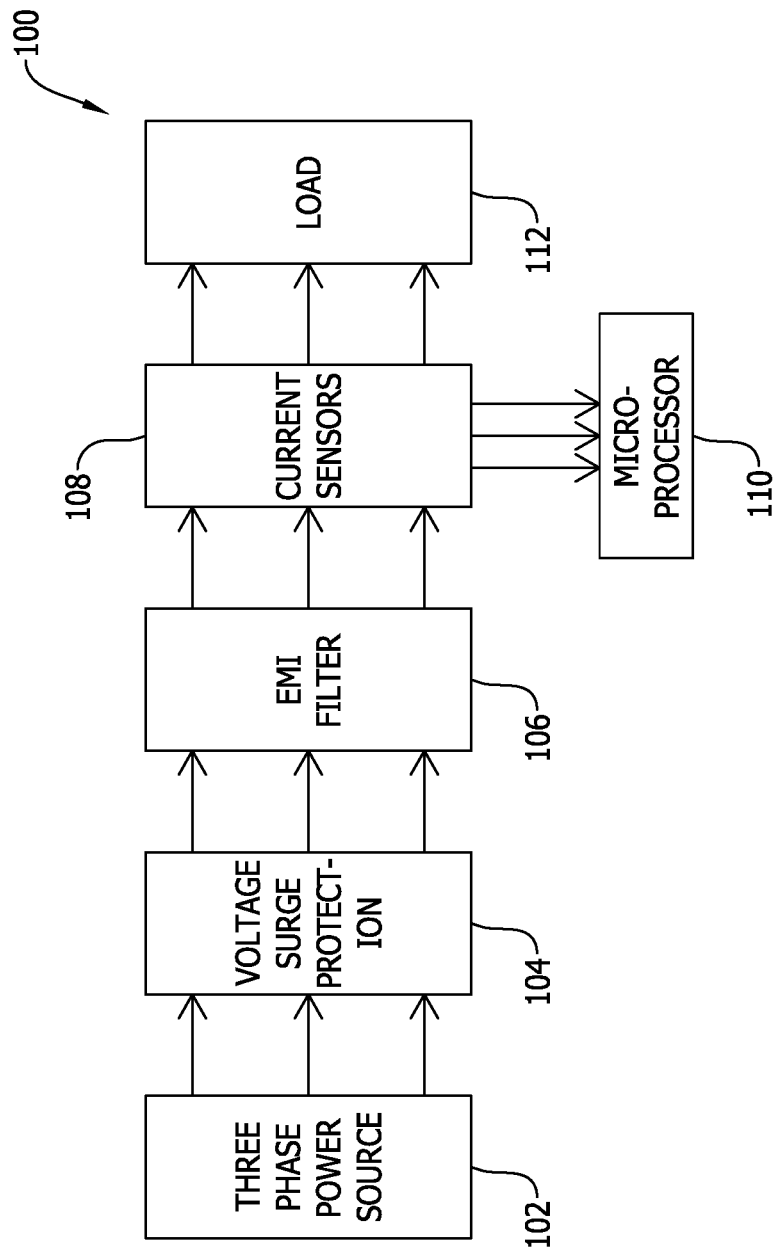
FIG. 1 is a block diagram of an exemplary three-phase power system with loss of phase detection.

FIG. 1 is a block diagram of an exemplary three-phase power system 100 with loss of phase detection that includes a three-phase power source 102, a voltage surge protection circuit 104, an electromagnetic interference (EMI) filtering circuit 106, current sensors 108, a microprocessor 110, and a load 112. Load 112 is configured to be powered by three-phase power source 102. Current sensors 108 are coupled to respective phases of three-phase power source 102. Microprocessor 110 is configured to receive measurements from current sensors 108.

In the exemplary embodiment, three-phase power source 102 supplies a three-phase alternating current (AC) input voltage to load 112. However, three-phase power source 102 may supply any type of three-phase voltage that enables load 112 to function as described herein. In the exemplary embodiment, voltage surge protection circuit 104 and EMI filtering circuit 106 receive the three phases of three-phase power source 102 before the phases enter current sensors 108. Voltage surge protection circuit 104 may be any circuit that stops surges of voltage from reaching a remainder of a circuit. EMI filtering circuit 106 may be any circuit that limits the respective electrical noise coupled back to the three phase power source. In alternative embodiments, voltage surge protection circuit 104, EMI filtering circuit 106, or both may be omitted from three-phase power system 100.

Current sensors 108 receive respective currents directly from three-phase power source 102. Current sensors 108 measure amplitudes of respective currents from respective phases of three-phase power source 102. Current sensors 108 supply current measurements to microprocessor 110. Microprocessor 110 receives current measurements from current sensors 108. Microprocessor 110 detects a loss of phase in respective phases based on the current measurements. Microprocessor 110 may detect a power imbalance based on the current measurements. Microprocessor 110 may calculate power consumption and efficiency of load 112. Voltage passes through current sensors 108 from three-phase power source 102 to load 112. Load 112 can be any load that is configured to be powered by three-phase power source 102. Load 112 may include a rectifier or an inverter to change the AC voltage to direct current (DC) voltage. Load 112 may be a three-phase motor or other power electronics.

Figure 2:
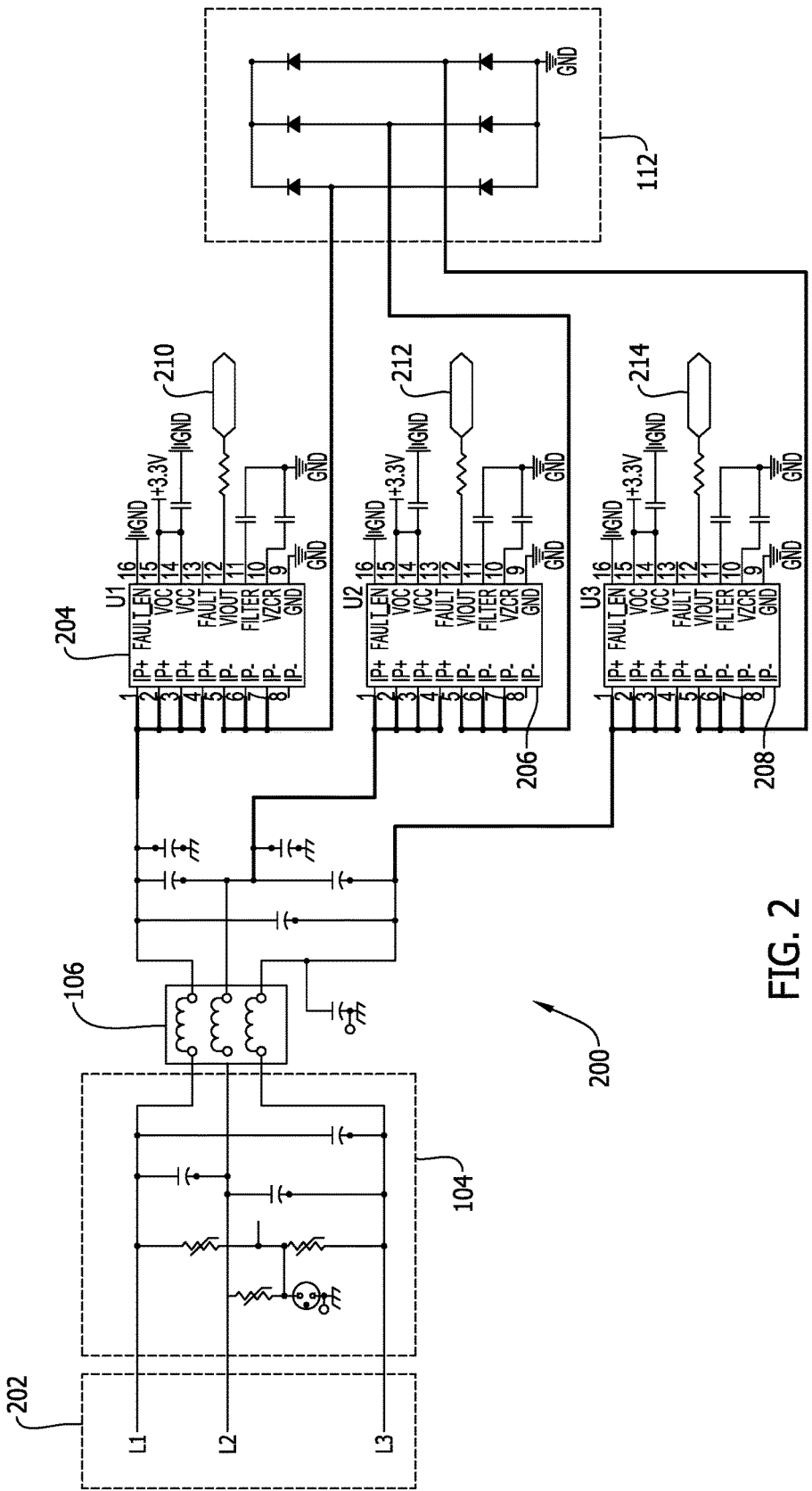
FIG. 2 is a schematic diagram of the exemplary three-phase power system shown in FIG. 1.

FIG. 2 is a schematic diagram of exemplary circuit 200 with loss of phase detection for exemplary three-phase power system 100, shown in FIG. 1. Circuit 200 includes voltage surge protection circuit 104, EMI filtering circuit 106, and load 112, all shown in FIG. 1, and a three-phase power source 202 and current sensors 204, 206, and 208. Three-phase power source 202 supplies load 112 with power. In the exemplary embodiment, three-phase power source 202 is shown as three voltage sources. However, three-phase power source 202 can be any three-phase power source. Three-phase power source 202 may include three AC buses that are configured to be coupled to utility power, a battery, or any other suitable power source. Power passes through voltage protection circuit 104, EMI filtering circuit 106, and current sensors 204, 206 and 208 before being supplied to load 112.

Current sensors 204, 206, and 208, for example, are any device that generates a signal that represents current amplitude. In one embodiment, current sensors 204, 206, and 208 are Hall Effect integrated circuit current sensors. In alternative embodiments, current sensors 204, 206, and 208 may be, for example, current clamp meters, Fluxgate Transformer Type sensors, resistors, or any other current sensor that functions as described above. In the exemplary embodiment, current sensors 204, 206, and 208 are ACS710KLATR-12CB-T current sensors. In alternative embodiments, current sensors 204, 206, and 208 may be, for example, CTSR200C-IS4 magnetic current sensors or any other current sensor that functions as described above. Further, in the exemplary embodiment, load 112 includes two rectifiers coupled to current sensors 204, 206 and 208. However, load 112 may include any load that is configured to be powered by a three-phase power source. Load 112 may include a rectifier, an inverter, a three-phase motor, or any other suitable power electronics.

As described above, three-phase power source 202 supplies AC voltage to voltage surge protection circuit 104 and EMI filtering circuit 106 before supplying voltage to current sensors 204, 206, and 208. Currents pass through EMI filtering circuit 106 from respective phases of three-phase power source 202 to respective current sensors 204, 206, and 208. Each respective current sensor 204, 206, and 208 measures current from respective phase of three-phase power source 202. Current sensors 204, 206, and 208 produce current measurements 210, 212, and 214, respectively. Current measurements 210, 212, and 214 are signals produced by current sensors 204, 206, and 208 that represent a measurement from the current, i.e., amplitude of current, and the signals are time-varying voltages that are proportional to an amplitude of the current when current measurements 210, 212, and 214 are taken by current sensors 204, 206, and 208. Current measurements 210, 212, and 214 are supplied to microprocessor 110 that processes current measurements 210, 212, and 214 and detects loss of phase from the current measurements 210, 212, and 214.

In the exemplary embodiment, high voltages from three-phase power source 202 are isolated from microprocessor 110, shown in FIG. 1. Current measurements 210, 212, and 214 are transmitted to microprocessor 110 from current sensors 204, 206, and 208. Such isolation reduces the risk of microprocessor 110 being damaged from high voltage surges.

Figure 3:
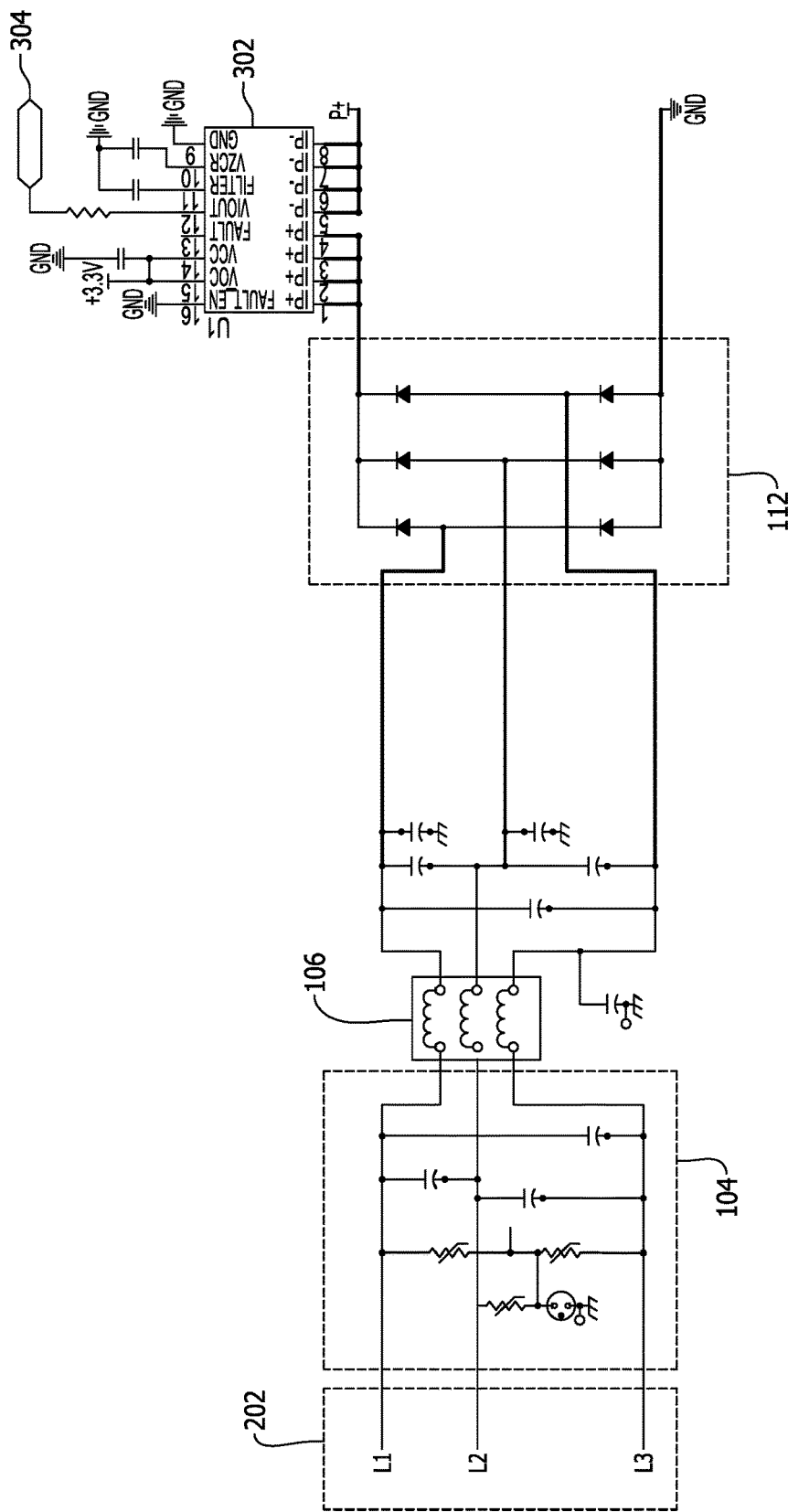
FIG. 3 is another schematic diagram of the exemplary three-phase power system shown in FIG. 1.

In another embodiment, loss of phase detection for exemplary three-phase power system 100 may be a circuit 300 that contains only one current sensor 302, as shown in FIG. 3. Circuit 300 includes voltage surge protection circuit 104, EMI filtering circuit 106, and load 112, shown in FIG. 1, three-phase power source 202, shown in FIG. 2, and current sensor 302 and current measurement 304. Current sensor 302 can be any current sensor, as described above for current sensors 204, 206, and 208, shown in FIG. 2. Current measurement 304 is a signal produced by current sensor 302 that represents a measurement from the current, i.e., current amplitude, like as described above for current measurements 210, 212, and 214, shown in FIG. 2.

In the exemplary embodiment, load 112 is an AC to direct current (DC) converter, and the converter is coupled to a DC bus, not illustrated. Current sensor 302 is coupled to the DC bus. Current sensor 302 is configured to supply current measurement 304 to microprocessor 110, shown in FIG. 1. In one embodiment, microprocessor 110 is configured to compare a predetermined expected current value for a loss of phase condition with current measurement 304 to determine if there is a loss of phase in three-phase power source 202. For example, if current measurement 304 is constant and different from the current value for a loss of phase condition and the current measurement 304 becomes the current value for a loss of phase condition and holds at that value for a period of time, microprocessor 110 will detect a loss of phase. In another embodiment, microprocessor 110 reads current measurement 304 and may use a minimum/maximum function to determine if there is a change in current flow in circuit 300. For example, if current measurement 304 maintains a constant minimum and maximum and then the range gets bigger or smaller for a period of time, microprocessor 110 will detect a change in current flow. In alternative embodiments, microprocessor 110 may use both the predetermined expected current value and minimum/maximum functions when reading current measurement 304 to determine if there is a loss of phase/change in current flow in circuit 300.

Figure 4:
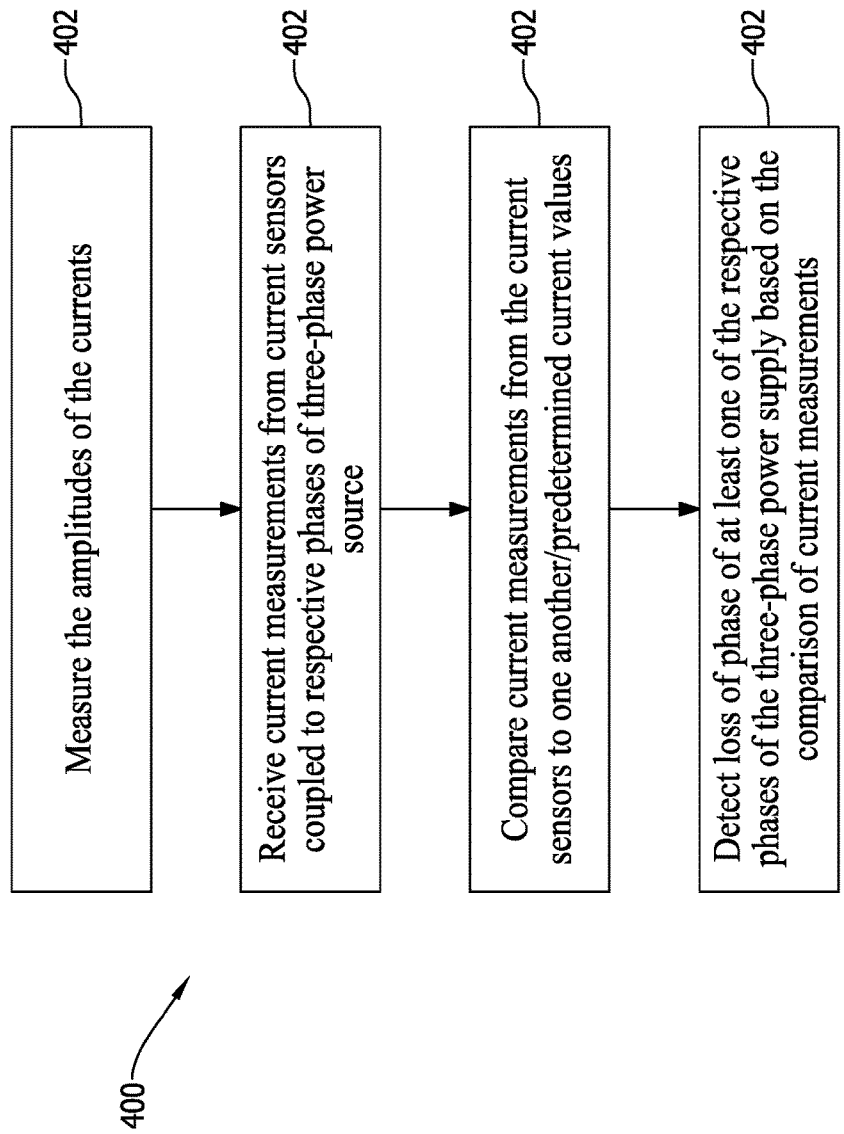
FIG. 4 is a flow diagram of an exemplary method of determining loss of phase in the three-phase power system shown in FIG. 1 and FIG. 2.

FIG. 4 is a flow diagram of an exemplary method 400 of determining loss of phase in three-phase power systems, 100, 200, and 300, shown in FIG. 1, FIG. 2, and FIG. 3, respectively. Method 400 may be embodied on or in circuits 100, 200, and 300. Referring now to the microprocessor 110 of FIG. 1 and current sensors 204, 206, and 208 and power source 202 of FIG. 2, current sensors 204, 206, and 208 measure 402 the amplitudes of respective currents supplied by three-phase power source 202. Microprocessor 110 receives 404 current measurements from current sensors 204, 206, and 208 coupled to respective phases of three-phase power source 202. Additionally, microprocessor 110 compares 406 current measurements 210, 212, and 214 from current sensors 204, 206, and 208 to one another. Further, microprocessor 110 detects 408 loss of phase of at least one of the respective phases of three-phase power source 202 based on the comparison 306 of current measurements 210, 212, and 214.

Current sensors 204, 206, and 208 measure 402 amplitudes of respective currents. Current sensors 204, 206, and 208 output signals representing current measurements 210, 212, and 214. Signals representing current measurements 210, 212, and 214 are voltages that are proportional to current conducted through by current sensors 204, 206, and 208. Current measurements 210, 212, and 214 are received 404 by microprocessor 110. Microprocessor 110 compares 406 current measurements 210, 212, and 214 to each other.

In the exemplary embodiment, for a peak positive current, current sensors 204, 206, and 208 produce a signal of 3.3 volts (V) that represents current measurements 210, 212, and 214. For zero current, current sensors 204, 206, and 208 produce a signal of 1.65 V that represents current measurements 210, 212, and 214. For a peak negative current, current sensors 204, 206, and 208 produce a signal of 0 V. All signals are received by microprocessor 110. Since the current supplied from three-phase power source 202 is alternating, many signals at or between 0 V and 3.3 V are expected. However, if the voltage readings stay consistently at 1.65 V, or zero current, for a predetermined period of time, loss of phase is detected 408 by microprocessor 110. Further, the signals that represent current measurements 210, 212, and 214 are analyzed by microprocessor 110 for proper amplitude in order to determine a critical phase imbalance. Additionally, microprocessor 110 utilizes current measurements 210, 212, and 214 to calculate phase and frequency of current, power consumption, and efficiency of load 112.

Referring now to microprocessor 110, shown in FIG. 1, and current sensor 302 and current measurement 304, shown in FIG. 3, current sensor 302 measures 402 the amplitude of rectified DC voltage. Microprocessor 110 receives 404 current measurement 304 and compares 406 current measurement 304 to a predetermined expected current value loaded into microprocessor 110. Loss of phase in three-phase power source 202 is detected 408 when the current measurement 304 and predetermined expected current value in microprocessor 110 are different. In alternative embodiments, a change in current flow can be detected when a minimum/maximum function is used by microprocessor 110 on current measurement 304 to determine if the current flow has changed in circuit 300.

A technical effect of the circuit, methods, and systems described herein may include one or more of: (a) coupling current sensors to respective phases of a three-phase power source configured to power a load, and coupling a microprocessor to the current sensors to detect a loss of phase in the respective phases of the three-phase power source to protect the load from wear, overworking, overheating, and potential shut downs due to loss of phase in the three-phase power source; (b) configuring the microprocessor to calculate phase and frequency of the currents from the current sensors based on the amplitudes of the currents over time, the phase and current measurements being used to further determine phase imbalance in the three-phase power source and power consumption and efficiency of the load; (c) configuring the microprocessor to only be coupled to the current sensors, not the voltage line from the power source, reducing the risk of the microprocessor being damaged due to voltage surges through the circuit; and (d) current sensors and measurements give high resolution of actual current passing through current sensors and allow power factor correction to be carried out in the circuit.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms processor, processing device, and controller.

The systems and methods described herein are not limited to the specific embodiments described herein, but rather, components of the systems and/or steps of the methods may be utilized independently and separately from other components and/or steps described herein.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A circuit comprising:
    a plurality of current sensors coupled to respective phases of a three-phase power source configured to supply power to a load; and
    a microprocessor coupled to said plurality of current sensors and configured to:
        receive current measurements from said plurality of current sensors; and
        detect a loss of at least one of the respective phases based on the current measurements.

2. The circuit of claim 1, wherein the load is a motor with at least one phase.

3. The circuit of claim 1, wherein the plurality of current sensors are further configured to measure amplitudes of each current of the respective phases.

4. The circuit of claim 3, wherein the microprocessor is further configured to determine frequency and phase of each current of the respective phases based on the amplitude measurements of each current over time.

5. The circuit of claim 1, wherein the microprocessor is further configured to detect a power imbalance based on the current measurements from the plurality of current sensors over time.

6. The circuit of claim 1, wherein the microprocessor is further configured to calculate power consumption of the load based on the current measurements from the plurality of current sensors over time.

7. The circuit of claim 1, wherein the microprocessor is further configured to detect decreasing efficiency of the load based on the current measurements from the plurality of current sensors over time.

8. A circuit comprising:
a plurality of alternating current (AC) buses configured to be coupled to a three-phase power source;
a direct current (DC) bus;
an AC to DC converter coupled to said plurality of AC buses and said DC bus, said AC to DC converter configured to convert AC power to DC power;
a current sensor coupled to said DC bus; and
a microprocessor coupled to said current sensor and configured to:
receive current measurements from said current sensor; and
detect a loss of at least one phase of the three-phase power source by comparing current measurements from said current sensor to a predetermined expected current value for a loss of phase condition.

9. The circuit of claim 8, wherein the microprocessor further detects a loss of phase in at least one phase of the three-phase power source by using a minimum and maximum function on the current measurements to determine if there is a change in current flow.

10. The circuit of claim 9, wherein the microprocessor further detects a loss of phase in at least one phase of the three-phase power source by comparing current measurements from the current sensor to a predetermined expected current value for a loss of phase condition and using a minimum and maximum function on the current measurements to determine if there is a change in current flow.

11. The circuit of claim 8, wherein the current sensor is configured to measure an amplitude of current of the DC bus.

12. The circuit of claim 8, wherein the microprocessor compares an amplitude of the current measurement and the predetermined expected current value for a loss of phase condition to detect a loss of phase.

13. The circuit of claim 8, wherein the current sensor is a Hall Effect integrated circuit current sensor.

14. The circuit of claim 8, wherein the plurality of AC buses are further configured to supply power to a load.

15. A method for detecting a loss of phase in three-phase equipment, the method comprising:
measuring amplitudes of a plurality of current measurements from a plurality of current sensors coupled to respective phases of the three-phase power source;
receiving, at a microprocessor, current measurements from the plurality of current sensors coupled to respective phases of the three-phase power source;
comparing the plurality of current measurements from the plurality of current sensors to one another; and
detecting a loss of phase of at least one of the respective phases based on the current measurements from the plurality of current sensors.

16. The method of claim 15, wherein the method further comprises generating a signal that represents current amplitudes from the plurality of current measurements.

17. The method of claim 16, wherein the method further comprises computing frequency and phase from the signals that represent current amplitudes over time.

18. The method of claim 16, wherein the method further comprises detecting a power imbalance from the signals that represent current amplitudes over time.

19. The method of claim 16, wherein the method further comprises calculating power consumption of a load from the signals that represent current amplitudes over time.

20. The method of claim 16, wherein the method further comprises detecting decreasing efficiency of a load based on the signals that represent current amplitudes over time.

* * * * *